US008298842B2

(12) United States Patent
Son et al.

(10) Patent No.: US 8,298,842 B2
(45) Date of Patent: Oct. 30, 2012

(54) METHOD FOR MANUFACTURING SEMICONDUCTOR LIGHT-EMITTING DEVICE

(75) Inventors: Su Hyoung Son, Hwaseong-si (KR); Kyoung Jin Kim, Goyang-si (KR); Won Keun Cho, Paju-si (KR); Eun Mi Ko, Paju-si (KR); Hyung Sun Hwang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/976,492

(22) Filed: Dec. 22, 2010

(65) Prior Publication Data
US 2012/0070924 A1 Mar. 22, 2012

(30) Foreign Application Priority Data

Sep. 17, 2010 (KR) .................. 10-2010-0091807

(51) Int. Cl.
*H01L 21/00* (2006.01)
(52) U.S. Cl. ............... 438/29; 257/98; 257/E33.068
(58) Field of Classification Search .......... 257/88, 257/95, 98, 103, 117, 594, E21.119, E33.005, 257/E33.068, E33.074; 438/29
See application file for complete search history.

(56) References Cited

U.S. PATENT DOCUMENTS

| | | | | |
|---|---|---|---|---|
| 6,068,788 | A * | 5/2000 | Kezuka et al. .......... | 252/79.1 |
| 6,159,865 | A * | 12/2000 | Kezuka et al. .......... | 438/745 |
| 7,683,386 | B2 * | 3/2010 | Tanaka et al. .......... | 257/88 |
| 7,804,101 | B2 * | 9/2010 | Niki et al. .......... | 257/98 |
| 8,044,422 | B2 * | 10/2011 | Dai et al. .......... | 257/98 |
| 2003/0186088 | A1 * | 10/2003 | Kato et al. .......... | 428/698 |
| 2005/0001227 | A1 * | 1/2005 | Niki et al. .......... | 257/98 |
| 2005/0179130 | A1 * | 8/2005 | Tanaka et al. .......... | 257/730 |
| 2006/0180180 | A1 * | 8/2006 | Tan .......... | 134/26 |
| 2007/0206130 | A1 * | 9/2007 | Wuu et al. .......... | 349/88 |
| 2008/0070413 | A1 * | 3/2008 | Chen et al. .......... | 438/700 |
| 2008/0142813 | A1 * | 6/2008 | Chang et al. .......... | 257/77 |
| 2008/0242103 | A1 * | 10/2008 | Ohmuro et al. .......... | 438/745 |
| 2010/0025684 | A1 * | 2/2010 | Shinohara et al. .......... | 257/49 |
| 2010/0059789 | A1 * | 3/2010 | Choi .......... | 257/103 |
| 2010/0197055 | A1 * | 8/2010 | Tanaka et al. .......... | 438/29 |
| 2010/0314991 | A1 * | 12/2010 | Hsu et al. .......... | 313/499 |

FOREIGN PATENT DOCUMENTS

| | | | |
|---|---|---|---|
| JP | 2006066442 A | * | 3/2006 |
| JP | 2009123717 A | * | 6/2009 |

* cited by examiner

*Primary Examiner* — William F Kraig
(74) *Attorney, Agent, or Firm* — McKenna Long & Aldridge, LLP

(57) ABSTRACT

Disclosed is a method for manufacturing a semiconductor light-emitting device, which carries out a wet-etching process after a dry-etching process so as to form protrusions in a surface of a substrate for growing a nitride semiconductor material thereon. The method comprises coating a substrate with photoresist; forming a mask pattern on the substrate by selectively removing the photoresist; forming protrusions on the substrate by dry-etching the substrate with the mask pattern through the use of etching gas; wet-etching the dry-etched substrate through the use of etching solution; forming a first semiconductor layer on the substrate including the protrusions; forming an active layer on the first semiconductor layer; forming a second semiconductor layer on the active layer; etching predetermined portions of the active layer and second semiconductor layer until the first semiconductor layer is exposed; and forming a first electrode on a predetermined portion of the first semiconductor layer, wherein the active layer and second semiconductor layer are not formed on the predetermined portion of the first semiconductor layer, and forming a second electrode on the second semiconductor layer.

10 Claims, 9 Drawing Sheets

|  | Power (Watt) | Power (Lumen) |
|---|---|---|
| Power emitted by the sources (MQW) (1) | 0.00147156 Watt | 1 Lumen |
| Generated Power | 0.00147156 Watt | 1 Lumen |
| Power absorbed in the system(Chip) | 0.00108582 Watt | 0.737867 Lumen |
| Power outside the system (2) | 0.000385745 Watt | 0.262133 Lumen |

LIGHT EXTRACTION
EFFICIENCY = 26%

(b)

|  | Power (Watt) | Power (Lumen) |
|---|---|---|
| Power emitted by the sources (MQW) (1) | 0.00147156 Watt | 1 Lumen |
| Generated Power | 0.00147156 Watt | 1 Lumen |
| Power absorbed in the system(Chip) | 0.000460758 Watt | 0.313109 Lumen |
| Power outside the system (2) | 0.0010108 Watt | 0.686891 Lumen |

LIGHT EXTRACTION
EFFICIENCY = 69%

METHOD FOR MANUFACTURING SEMICONDUCTOR LIGHT-EMITTING DEVICE

CROSS REFERENCE TO RELATED APPLICATIONS

This application claims the benefit of the Korean Patent Application No. 10-2010-0091807 filed on Sep. 17, 2010, which is hereby incorporated by reference as if fully set forth herein.

BACKGROUND OF THE INVENTION

1. Field of the Invention

The present invention relates to a semiconductor device, and more particularly, a method for manufacturing a nitride semiconductor light-emitting device.

2. Discussion of the Related Art

A nitride semiconductor light-emitting device includes ultraviolet, blue, and green light-emitting regions. Especially, a GaN-based nitride semiconductor light-emitting device can be applied to an optical device of red/green light-emitting diode (LED), and an electronic device corresponding a high-speed switching or high-power device of MESFET (Metal Semiconductor Field Effect Transistor) or HEMT (Hetero Junction Field-Effect Transistor).

FIG. 1 is a cross section view illustrating a nitride semiconductor light-emitting device according to the related art. FIG. 2A illustrates totally-reflected light in a semiconductor light-emitting device according to the related art. FIG. 2B illustrates a dislocation generated in a semiconductor light-emitting device according to the related art.

As shown in FIG. 1, the nitride semiconductor light-emitting device 100 according to the related art includes a substrate 110, a buffer layer 120, an undoped semiconductor layer 130, an N-type nitride semiconductor layer 140, an active layer 150, a P-type nitride semiconductor layer 160, a transparent electrode layer 170, a P-type electrode 180 on the transparent electrode layer 170, and an N-type electrode 190 on the N-type nitride semiconductor layer 140 exposed by etching the active layer 150 and a predetermined portion of the P-type nitride semiconductor layer 160.

As a voltage is applied to the P-type electrode 180 and N-type electrode 190 in the semiconductor light-emitting device 100, a forward bias is applied between the P-type nitride semiconductor layer 160 and N-type nitride semiconductor layer 140, whereby electrons and holes are recombined in the active layer 150, to thereby emit light.

An important issue in the nitride semiconductor light-emitting device is how effectively the light generated in the active layer 150 is extracted to the external. In case of the nitride semiconductor light-emitting device according to the related art, as shown in FIG. 2A, a refractive index of a composing material of the nitride semiconductor light-emitting device is larger than a refractive index of an ambient material (for example, air, resin, substrate, and etc.) in the vicinity of the nitride semiconductor light-emitting device. Thus, photons generated inside the nitride semiconductor light-emitting device are totally reflected, and are then re-absorbed into the inside of the nitride semiconductor light-emitting device without escaping from the nitride semiconductor light-emitting device, thereby lowering light extraction efficiency.

In order to overcome this problem, there has been proposed a method for forming a stacking-structure wall with a predetermined angle in the semiconductor light-emitting device according to the related art, to thereby extract some of the transverse light generated in the active layer 150. However, this method causes the complicated manufacturing process of the semiconductor light-emitting device, and the increase of manufacturing cost.

In addition, the semiconductor light-emitting device according to the related art is problematic in that a dislocation density of nitride-based semiconductor layer grown on the substrate is raised due to a stress caused by a difference of lattice constant between the substrate and the nitride-based semiconductor layer grown on the substrate.

SUMMARY OF THE INVENTION

Accordingly, the present invention is directed to a method for manufacturing a semiconductor light-emitting device that substantially obviates one or more problems due to limitations and disadvantages of the related art.

An advantage of the present invention is to provide a method for manufacturing a semiconductor light-emitting device, which carries out a wet-etching process after a dry-etching process so as to form protrusions in a surface of a substrate for growing a nitride semiconductor material thereon.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a method for manufacturing a semiconductor light-emitting device comprising: coating a substrate with photoresist; forming a mask pattern on the substrate by selectively removing the photoresist; forming protrusions on the substrate by dry-etching the substrate with the mask pattern through the use of etching gas; wet-etching the dry-etched substrate through the use of etching solution; forming a first semiconductor layer on the substrate including the protrusions; forming an active layer on the first semiconductor layer; forming a second semiconductor layer on the active layer; etching predetermined portions of the active layer and second semiconductor layer until the first semiconductor layer is exposed; and forming a first electrode on a predetermined portion of the first semiconductor layer, wherein the active layer and second semiconductor layer are not formed on the predetermined portion of the first semiconductor layer, and forming a second electrode on the second semiconductor layer.

In another aspect of the present invention, there is provided a method for manufacturing a semiconductor light-emitting device comprising: forming a mask pattern on a substrate to form protrusions; forming the protrusions on the substrate by dry-etching the substrate with the mask pattern through the use of etching gas; wet-etching the dry-etched substrate through the use of etching solution; and forming a light-emitting device layer on the wet-etched substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incor- In the drawings:

FIG. 7 is a table showing improvement of light extraction efficiency in a semiconductor light-emitting device according to the present invention by comparing light extraction efficiency in a related art semiconductor light-emitting device with light extraction efficiency in the semiconductor light-emitting device according to the present invention.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, a method for manufacturing a semiconductor light-emitting device according to the present invention will be described with reference to the accompanying drawings.

Figure 1:
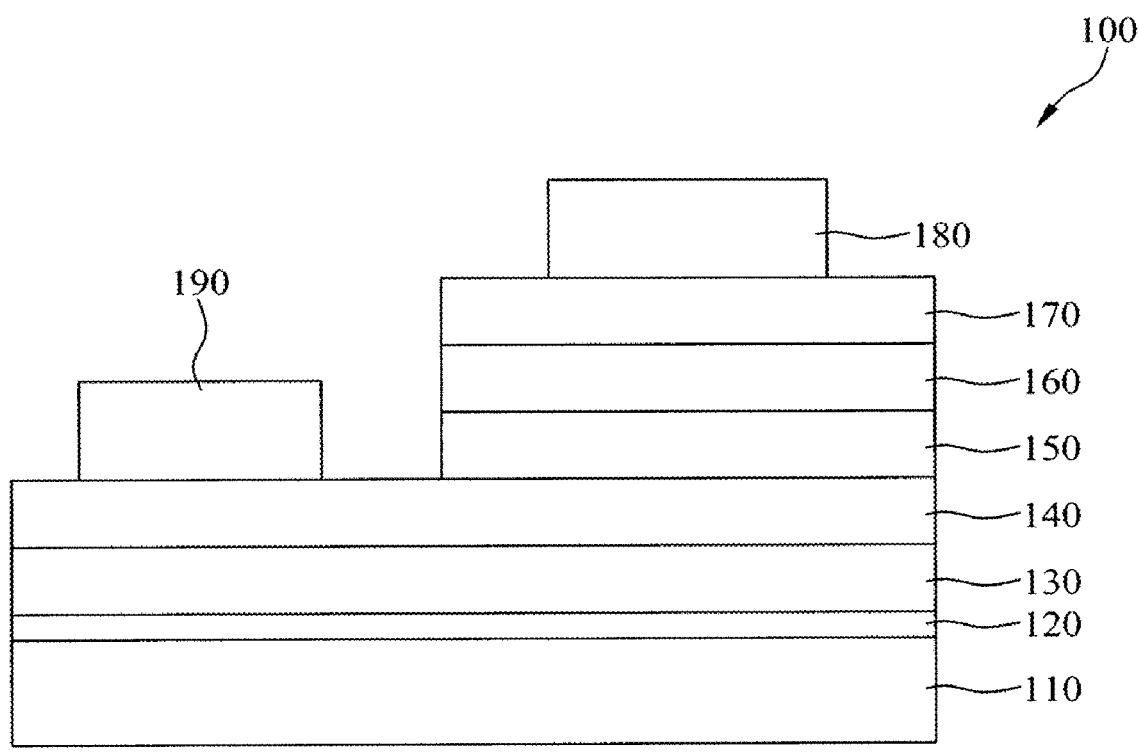
FIG. 1 is a cross section view illustrating a structure of a nitride semiconductor light-emitting device according to the related art.
Figure 2A:
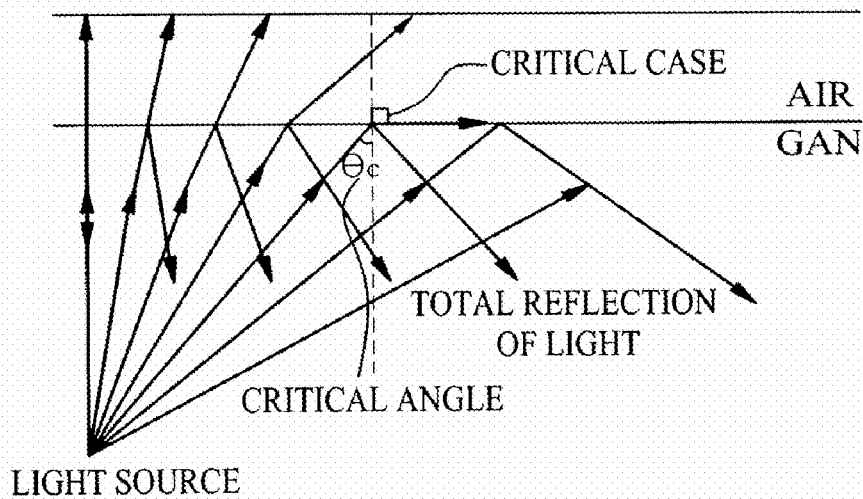
FIG. 2A illustrates totally-reflected light in a semiconductor light-emitting device according to the related art.
Figure 2B:
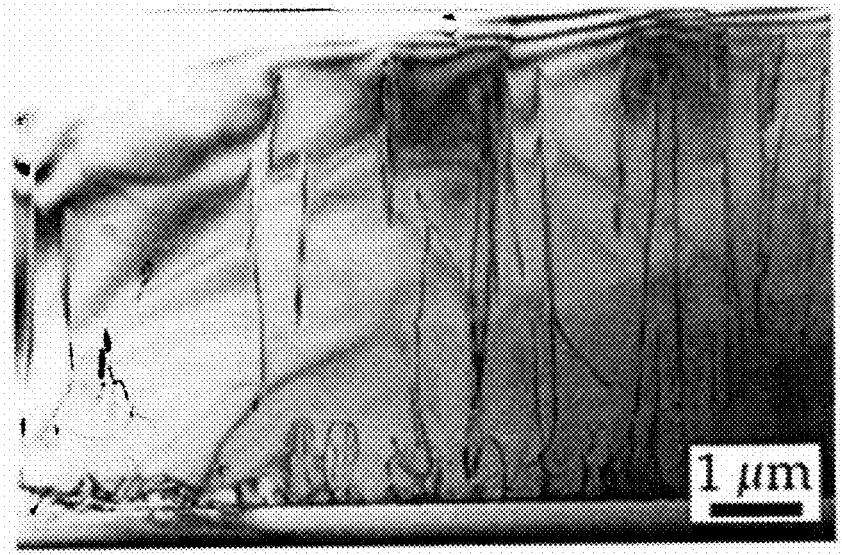
FIG. 2B illustrates a dislocation generated in a semiconductor light-emitting device according to the related art.
Figure 3A:
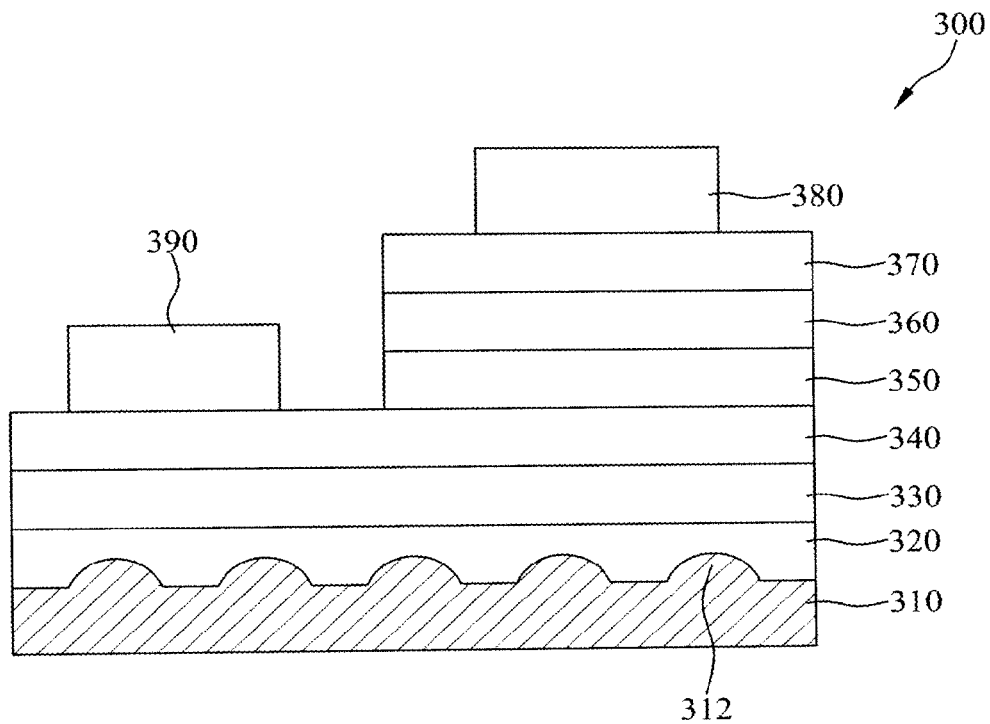
FIGS. 3A and 3B are cross section views illustrating a nitride semiconductor light-emitting device manufactured by a method according to the present invention.
Figure 3B:
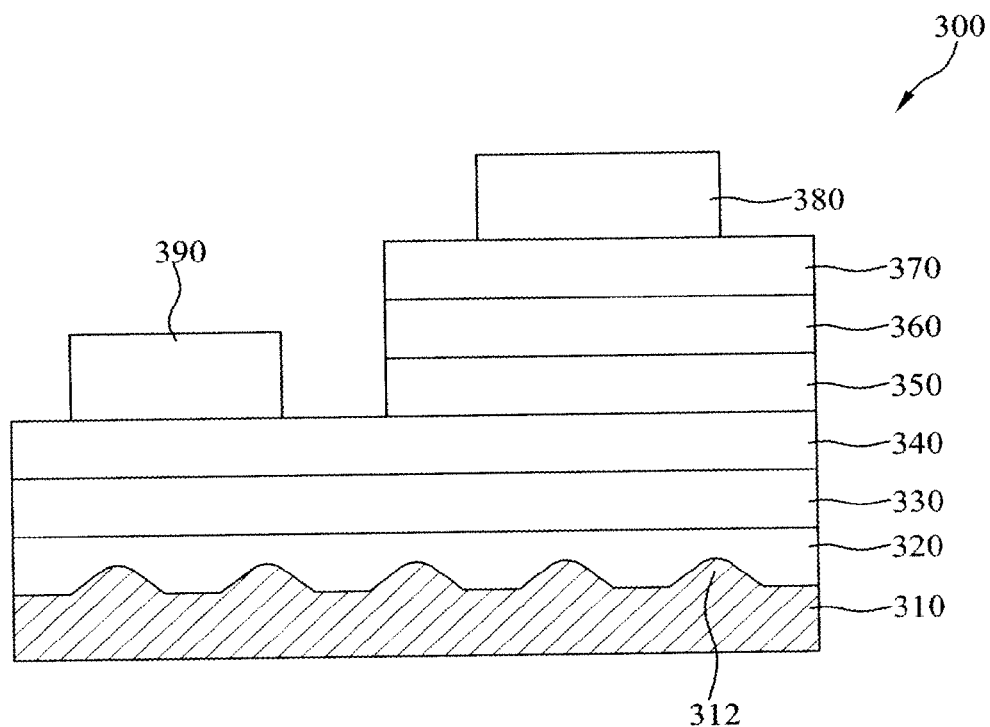

FIGS. 3A and 3B are cross section views illustrating a nitride semiconductor light-emitting device manufactured by a method according to the present invention.

The semiconductor light-emitting device according to the present invention is characterized in that plural protrusions (wherein, each protrusion is formed in a convex-lens configuration) are formed on a surface of a substrate for improvement of quality in a semiconductor layer growing on the substrate. That is, the semiconductor light-emitting device according to the present invention can improve light extraction efficiency owing to the substrate patterned with the plural protrusions.

Especially, dry-etching process and wet-etching process are used for formation of the protrusions on the substrate of the semiconductor light-emitting device according to the present invention, whereby byproducts are completely removed from the substrate.

As shown in FIGS. 3A and 3B, the semiconductor light-emitting device 300 manufactured by the method according to the present invention includes a substrate 310 on which one or more protrusions 312 are formed; a buffer layer 320; an undoped semiconductor layer 330; an N-type nitride semiconductor layer 340; an active layer 350; a P-type nitride semiconductor layer 360; a transparent electrode layer 370; a P-type electrode 380; and an N-type electrode 390. At this time, the buffer layer 320; undoped semiconductor layer 330; N-type nitride semiconductor layer 340; active layer 350; P-type nitride semiconductor layer 360; transparent electrode layer 370; P-type electrode 380; and N-type electrode 390 stacking on the substrate 310 may be generically referred to as light-emitting device layers.

Since there is no commercially available substrate which has the same crystal structure as crystals of nitride semiconductor material growing thereon while exhibiting a lattice matching, a sapphire substrate is primarily used for the substrate 310, in consideration of the lattice matching.

The sapphire substrate is a crystal body having Hexa-Rhombo R3c symmetry, which has the characteristics such as 13.001 Å lattice constant in the c-axis direction; 4.765 Å distance between lattices in the a-axis direction; and C(0001) plane, A(1120) plane, and R(1102) plane in the direction of the orientation plane of the sapphire. On the C plane of the sapphire substrate, the nitride semiconductor material is easily grown, and is also stable at a high temperature. In this respect, the sapphire substrate is primarily used as the substrate for blue or green light-emitting device. The aforementioned embodiment of the present invention discloses that the sapphire substrate is used as the substrate 310, but not necessarily. Selectively, the substrate 310 may be formed of GaN, SiC, ZnO, GaP, GaAs, or a conductive material.

For improving light extraction efficiency and quality of the nitride semiconductor material growing on the substrate 310, one or more protrusions 312 are formed on the substrate 310 of the semiconductor light-emitting device 300 according to the present invention, as shown in FIGS. 3A and 3B. In this case, the protrusions 312 may be formed by dry-etching or wet-etching the substrate 310.

The protrusion 312 may be formed in a hemisphere shape on the surface of the substrate 310, as shown in FIG. 3A; or the protrusion 312 may be formed in a triangular pyramid on the surface of the substrate 310, as shown in FIG. 3B.

The protrusion 312 of the present invention may be formed in such a way that its one vertical cross section is a curved-surface shape, as shown in FIG. 3A; or the protrusion 312 may be formed in such a way that its one vertical cross section is a polygonal shape such as triangle, as shown in FIG. 3B. That is, the protrusion 312 may vary in shape, for example, hemisphere, triangular pyramid, and etc.

Also, the plural protrusions 312 may be regularly or irregularly arranged on the substrate 310.

The dry-etching or wet-etching process may be used for formation of the aforementioned protrusions 312.

That is, the wet-etching process may be additionally carried out after the dry-etching process, to thereby completely remove byproducts, which might remain on the surface of the substrate 310 even after the dry-etching process. According as the wet-etching process may be additionally carried out after the dry-etching process, it is possible to remove the byproducts which remain after an organic cleaning process following the dry-etching process.

Hereinafter, the aforementioned dry-etching process and wet-etching process will be explained with reference to FIG. 4.

Referring once again to FIGS. 3A and 3B, the buffer layer 320 is provided to decrease a difference of the lattice constant between the substrate 310 and the N-type nitride semiconductor layer 340. The buffer layer 320 is formed on the substrate 310 including the protrusions 312. The buffer layer 320 may be selectively formed in AlInN structure, InGaN/GaN super lattice structure, InGaN/GaN stacking structure, or AlInGaN/InGaN/GaN stacking structure.

The undoped semiconductor layer 330 is formed on the buffer layer 320, wherein the undoped semiconductor layer 330 may be formed of a GaN-based material. For example, the undoped semiconductor layer 330 may be formed on the buffer layer 320 by supplying $NH_3$ and tri-metal gallium (TMGa) at a temperature of 1500° C.

The aforementioned embodiment of the present invention includes both the buffer layer 320 and undoped semiconductor layer 330. However, a modified embodiment of the present invention may include any one of the buffer layer 320 and undoped semiconductor layer 330, or may include neither the buffer layer 320 nor undoped semiconductor layer 330.

The N-type nitride semiconductor layer 340 is formed on the undoped semiconductor layer 330. Typically, the N-type nitride semiconductor layer 340 is formed of GaN, AlGaN, InGaN, AlN, or AlInGaN. In this case, a dopant used for forming the N-type nitride semiconductor layer 340 may be Si, Ge, Sn, Se, or Te.

The N-type nitride semiconductor layer 340 may be formed by growing the aforementioned semiconductor material on the substrate 310 by MOCVD (Metal Organic Chemical Vapor Deposition), MBE (Molecular Beam Epitaxy), or HVPE (Hydride Vapor Phase Epitaxy).

The active layer 350 is provided to emit the light, which is obtained by forming a multiple quantum well (MQW) under such circumstances that a well is formed of InGaN layer, and a barrier layer is formed of (Al)GaN layer. A blue light-emitting diode uses a multiple quantum well structure of InGaN/GaN; and an ultraviolet light-emitting diode uses a multiple quantum well structure of GaN/AlGaN, InAlGaN/InAlGaN, or InGaN/AlGaN.

On improvement of efficiency in the active layer 350, a light wavelength can be controlled by changing a component of In or Al; or an internal quantum efficiency can be improved by changing a depth of the well in the active layer 350, the number of active layer 350, and the thickness of active layer 350.

The active layer 350 may be formed on the N-type nitride semiconductor layer 340 by MOCVD (Metal Organic Chemical Vapor Deposition), MBE (Molecular Beam Epitaxy), or HVPE (Hydride Vapor Phase Epitaxy).

The P-type nitride semiconductor layer 360 is formed on the active layer 350, wherein the P-type nitride semiconductor layer 360 may be formed of a typical nitride-based semiconductor material such as GaN, AlGaN, InGaN, AlN, or AlInGaN. In this case, a dopant used for forming the P-type semiconductor layer 360 may be Mg, Zn, or Be.

The P-type nitride semiconductor layer 360 may be formed by growing the aforementioned nitride-based semiconductor material on the active layer 350 by MOCVD (Metal Organic Chemical Vapor Deposition), MBE (Molecular Beam Epitaxy), or HVPE (Hydride Vapor Phase Epitaxy).

The transparent electrode layer 370 is formed on the P-type nitride semiconductor layer 360. Preferably, the transparent electrode layer 370 is formed of a material which is capable of reducing a contact resistance to the P-type nitride semiconductor layer 360 having a relatively-high energy band gap, and also having good light-transmitting property so as to upwardly transmit the light generated in the active layer 350 therethrough.

Generally, the transparent electrode layer 370 is formed in a dual-layered structure of Ni/Au. Preferably, the transparent electrode layer 370 is formed of a predetermined material such as Indium-Tin-Oxide (ITO), Cadmium-Tin-Oxide (CTO), or Titanium-Tungsten-Nitride (TiWN). The aforementioned predetermined material for the transparent electrode layer 370 can realize good light-transmitting property, but its contact resistance is relatively high.

The transparent electrode layer 370 may be formed by a deposition method such as CVD (Chemical Vapor Deposition) or E-beam Evaporator; or may be formed by sputtering. At this time, a heat treatment of about 400° C. to 900° C. is applied to improve ohmic contact property.

The P-type electrode 380 is formed on the transparent electrode layer 370. The P-type electrode 380 may be generally formed of aurum (Ar) or an alloy containing aurum (Au) by a deposition method such as CVD (Chemical Vapor Deposition) or E-beam evaporator, or by sputtering.

The N-type electrode 390 is formed on the mesa-etched N-type nitride semiconductor layer 340, wherein the N-type electrode 290 may be formed in a single-layered structure or multi-layered structure using a material selected from a material group of Ti, Cr, Al, Cu, and Au. The N-type electrode 390 may be formed on the N-type nitride semiconductor layer 340 by a deposition method such as CVD (Chemical Vapor Deposition) or E-beam evaporator, or by sputtering.

A method for manufacturing the light-emitting device according to the present invention will be described with reference to FIGS. 4A to 4F.

FIGS. 4A to 4F illustrate a method for manufacturing a semiconductor light-emitting device according to the present invention. FIG. 5 is an exemplary view illustrating a substrate from which byproducts are removed by a method for manufacturing a semiconductor light-emitting device according to the present invention. In this case, (a) of FIG. 5 illustrates a case the byproduct 500 remains on the substrate or protrusion after the dry-etching process; and (b) of FIG. 5 illustrates a case the byproduct 500 is removed from the substrate by the wet-etching process.

Figure 4A:
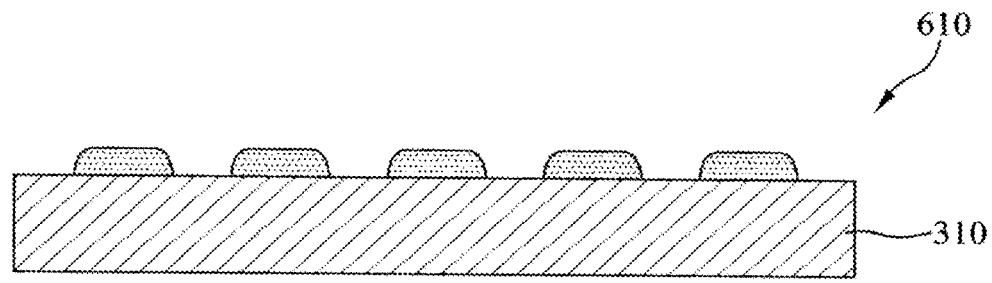
FIGS. 4A to 4F illustrate a method for manufacturing a semiconductor light-emitting device according to the present invention.
Figure 5:
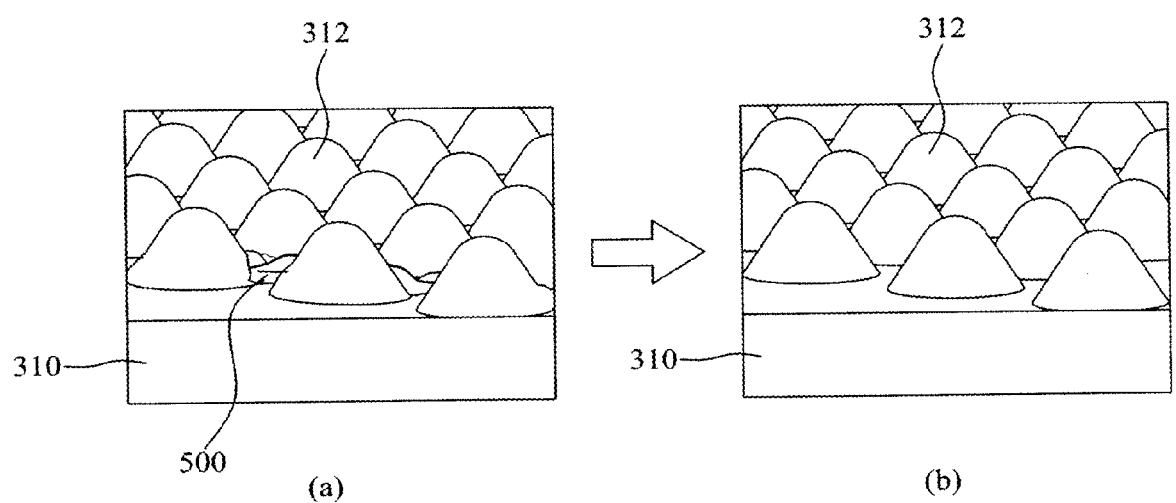
FIG. 5 is an exemplary view illustrating a substrate from which byproducts are removed by a method according to the present invention.

Referring to FIG. 4A, a mask pattern 610 is formed on the substrate 310, wherein the mask pattern 610 is formed of photoresist, polymer, oxide layer ($SiO_2$), nitride layer ($SiN_x$), aluminum oxide (Al2O3), or metal thin film. The mask pattern 610 is provided to form the protrusion 312.

A process for forming the mask pattern 610 through the use of photoresist will be explained in brief. First, after coating the substrate 310 with the photoresist, the photoresist is exposed, developed and baked through the use of mask for formation of the pattern, to thereby form the desired mask pattern 610 on the substrate 310. The baking method may be a baking method using heat, or baking method using UV rays.

Before coating the photoresist, a vaporization process is applied to the surface of the substrate, whereby the substrate is changed from the hydrophobic property to the hydrophilic property. This is to solve a problem of poor adhesion when photoresist is coated onto the substrate 310.

Figure 4B:
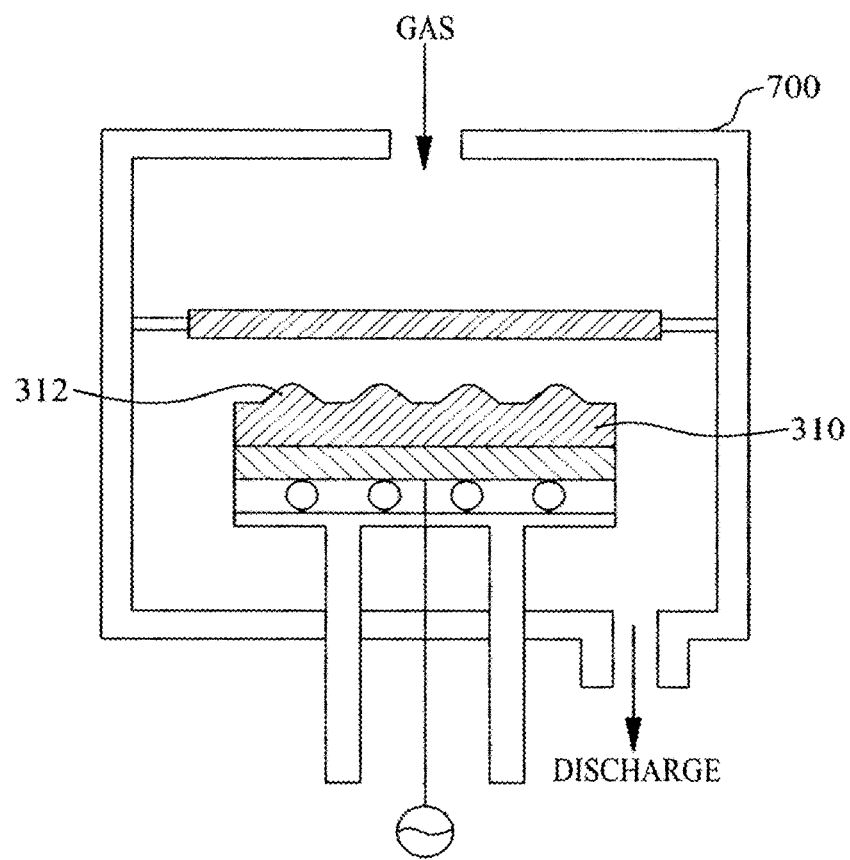

As shown in FIG. 4B, the substrate 310 with the mask pattern 610 formed therein is dry-etched within a chamber 700, whereby one or more protrusions 312 are formed on the substrate 310.

The dry-etching process corresponds to a micro-fabrication, which indicates an etching process using a reaction of vapor plasma. Since the dry-etching process is carried out within the chamber 700, it is possible to control all processing conditions, to thereby realize a precise pattern.

That is, as shown in FIG. 3A or 3B, the dry-etching process has to be carried out so as to obtain the protrusion 312 of the hemisphere or conic shape having different widths in lower and upper surfaces thereof.

The dry-etching process proceeds with a physical reaction by an ion impact on the substrate, a chemical reaction of reaction materials generated in plasma, or simultaneous physical and chemical reactions.

The physical dry-etching process indicates a surface abrasion generated by a momentum transfer when ions are accelerated toward the substrate to be etched by an electric field, and the accelerated ions collide with the substrate. At this time, the physical dry-etching process may be an ion-beam etching (or ion-beam milling), sputtering etching, and radio-frequency (RF) etching.

In case of the chemical dry-etching process, reactive seeds generated by plasma are supplied to the surface of the substrate to be etched, and are then reacted with atoms in the surface of the substrate, to thereby generate volatile gas, and to proceed with the etching process using the generated volatile gas.

In case of the physical and chemical dry-etching processes, the materials in the surface of the substrate 310 are activated by collision of ions, electrons, or photons on the surface of the substrate 310 to be etched, and then the activated materials in the surface of the substrate 310 are reacted with species remaining in the chemical reactor, to thereby generate volatile gas, and to proceed with the etching process using the generated volatile gas.

However, the aforementioned dry-etching process uses the gas (for example, Cl-based gas selected from a group including $Cl_2$, $BCl_3$, HCl, and $CCl_4$, and HBr-based gas including HBr) at the high temperature (40° C. or more). Thus, even though the substrate 310 is unloaded to the external after completely discharging the gas used for the dry-etching process, the gases remaining on the substrate 310 may react with the air, whereby the byproducts 500 remain on the substrate 310, as shown in (a) of FIG. 5.

The byproducts remaining on the substrate 310 may cause defects in the semiconductor layer stacking on the substrate 310, to thereby deteriorate the light extraction efficiency of the semiconductor light-emitting device.

Figure 4C:
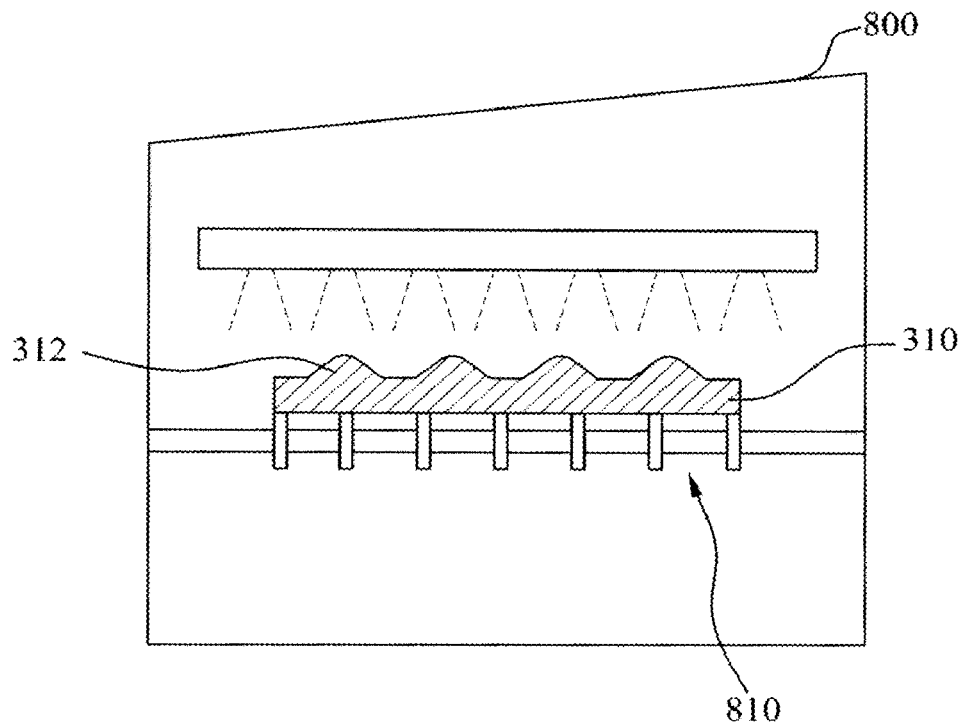

In order to remove the aforementioned byproducts remaining on the substrate 310 after the dry-etching process, the wet-etching process is additionally carried out through the use of wet-etching apparatus shown in FIG. 4C.

That is, the wet-etching process is to etch the substrate 310 under the wet atmosphere through the use of chemical (etchant) corroding and melting only the targeted metal, to thereby remove the byproducts on the surface of the substrate 310 and protrusion.

The wet-etching process may use a dipping method, a spraying method, or a spinning method. The dipping method is to dip the substrate 310 into a container filled with the etchant. The spraying method is to spray an etching solution onto the substrate 310 through a spraying nozzle. The spinning method is to apply an etching solution to the substrate 310 provided on a spinneret. For one example of the wet-etching apparatus, FIG. 4C illustrates the wet-etching apparatus 800 which etches the substrate 310 by spraying the etching solution onto the substrate 310 through the spraying nozzle while the substrate 310 is transferred through the use of transfer roller 810, and then cleans the substrate by spraying a cleaning solution to the substrate 310.

For the aforementioned wet-etching process, the etching solution selected from a group including HF, HI, $H_2SO_4$, $HNO_3$, and $H_3PO_4$ is used to wet-etch the substrate 310, to thereby remove the byproducts 500 from the surface of the substrate and/or protrusion after the dry-etching process.

Based on the experiments and simulation results using the various kinds of etching solution, it is preferable for the wet-etching process to use the etching solution which is obtained by mixing sulfuric acid and hydrogen peroxide in a ratio of 1:1 or 1:2, or by mixing sulfuric acid and phosphoric acid in a ratio of 1:1 or 1:2.

Based on the experiments and simulation results using the various temperatures, it is preferable for the wet-etching process to maintain the temperature within a range of 90° C.~120° C., to maximize the efficiency of removing the byproducts from the substrate 310.

As mentioned above, since the organic materials such as photoresist (PR) may be removed for the wet-etching process, there is no need to carry out the additional organic cleaning process.

That is, after the dry-etching process of the related art, the organic cleaning process is additionally required for removing the organic material such as photoresist (PR). However, the wet-etching process of the present invention is used together with the etching solution which is capable of removing the organic materials so that it is possible to omit the organic cleaning process.

Meanwhile, the wet etching process enables to additionally etch the protrusion according to the composition and amount of the etching solution. That is, the protrusion may be formed in such a way that its cross section may be formed in the curved-surface shape as shown in FIG. 3A, or may be formed in the polygonal shape including the triangular shape as shown in FIG. 3B.

Figure 4D:
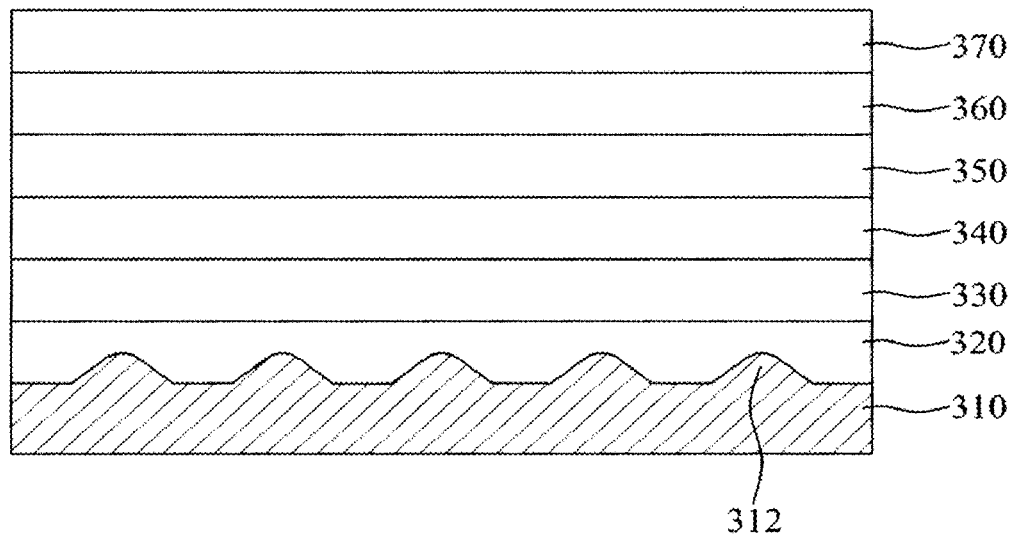

After forming the protrusion 312 on the substrate 310, and removing the byproducts 500 from the substrate 310 and protrusion 312 through the aforementioned process, as shown in FIG. 4D, the buffer layer 320, the undoped semiconductor layer 330, the N-type nitride semiconductor layer 340, the active layer 350, the P-type nitride semiconductor layer 360, and the transparent electrode layer 370 are sequentially formed on the substrate 310 with the protrusions 312. At least any one of the buffer layer 320 and undoped semiconductor layer 330 may be formed; or neither the buffer layer 320 nor undoped semiconductor layer 300 may be formed.

Figure 4E:
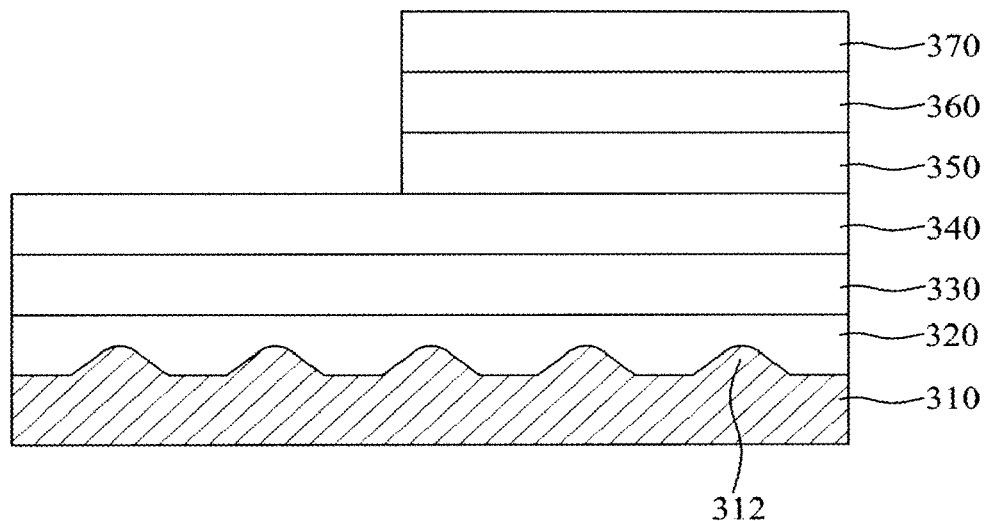

As shown in FIG. 4E, the mesa-etching is applied until the N-type nitride semiconductor layer 340 for formation of the N-type electrode 390.

Figure 4F:
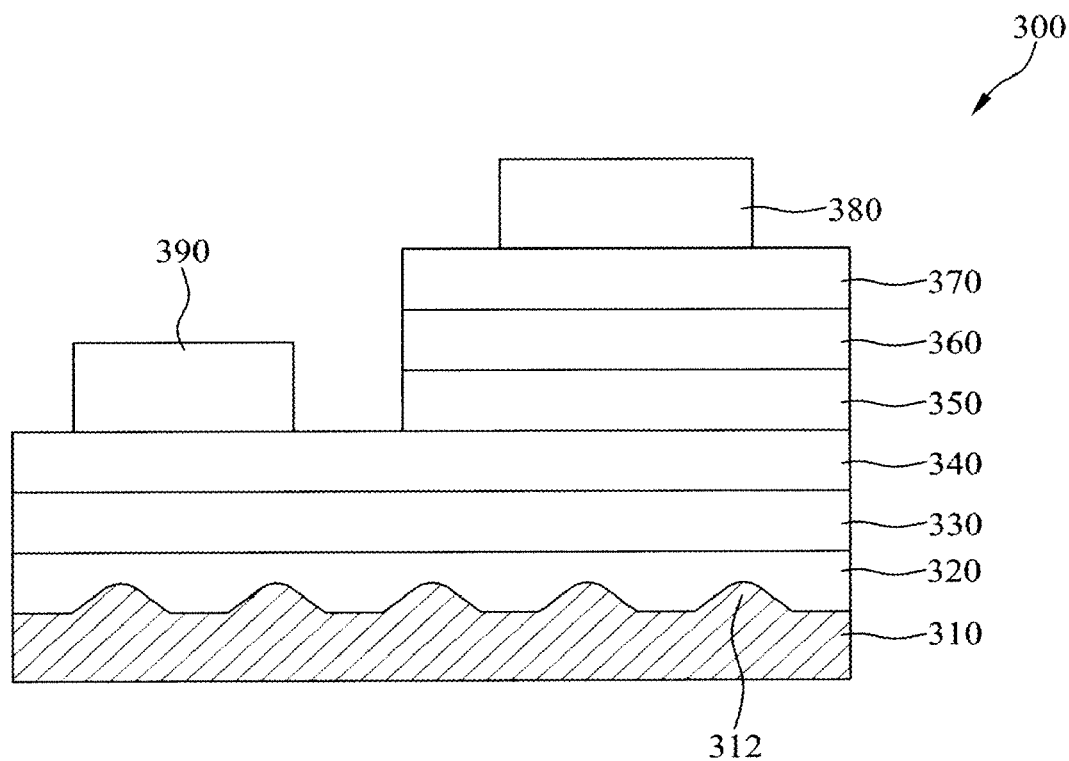

As shown in FIG. 4F, the P-type electrode 380 is formed on the transparent electrode layer 370, and the N-type electrode 390 is formed on the N-type nitride semiconductor layer 340.

For improving reliability of the semiconductor light-emitting device, although not shown, an insulating layer using an oxide such as $SiO_2$ is formed on the entire area of the semiconductor light-emitting device; the formed insulating layer is thinned by lapping and polishing processes; and then the semiconductor light-emitting device is divided into individual chips by a scribing process using laser or diamond.

Figure 6:
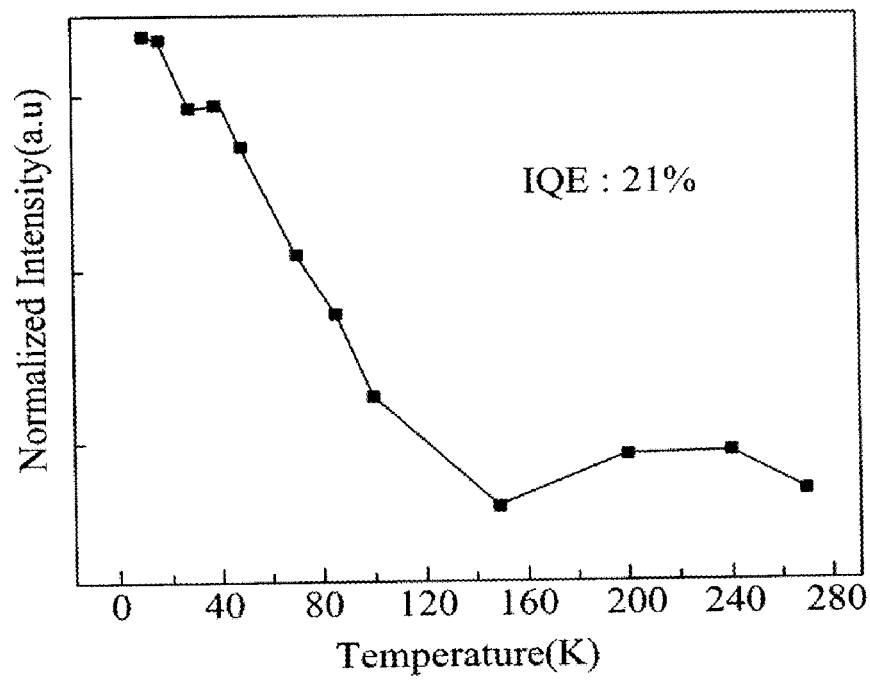
FIG. 6 is a graph showing improvement of internal quantum efficiency (IQE) in a semiconductor light-emitting device according to the present invention by comparing IQE in a related art semiconductor light-emitting device with IQE in the semiconductor light-emitting device according to the present invention.
Figure 6:
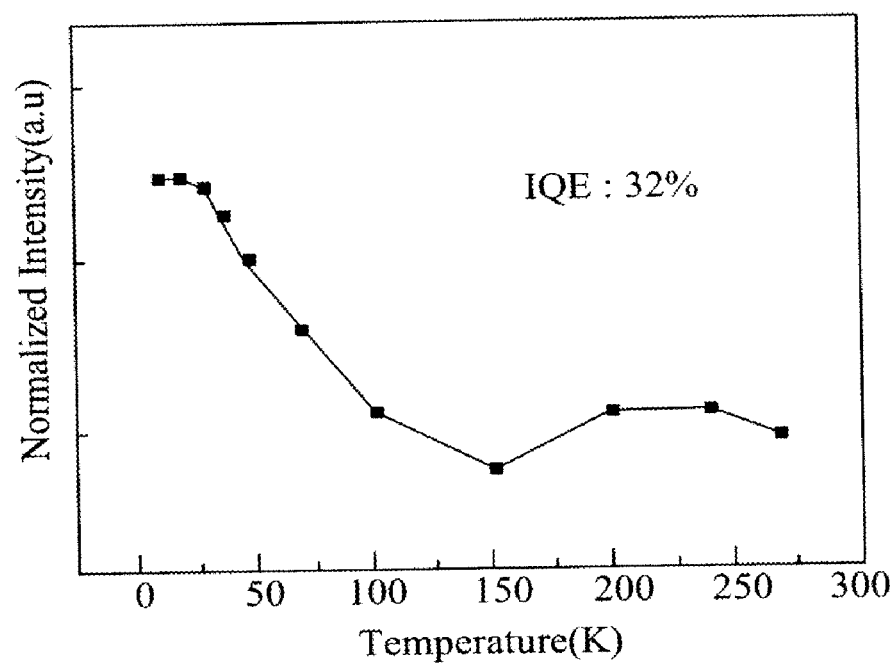

FIG. 6 is a graph showing the improvement of internal quantum efficiency (IQE) in the semiconductor light-emitting device according to the present invention by comparing IQE in a related art semiconductor light-emitting device with IQE in the semiconductor light-emitting device according to the present invention.

The related art semiconductor light-emitting device which is not provided with the protrusion shows only 21% IQE as shown in (a) of FIG. 6. Meanwhile, the semiconductor light-emitting device according to the present invention, which is provided with the protrusions 312 on the substrate 310, shows 32% IQE as shown in (b) of FIG. 6. In comparison with the related art semiconductor light-emitting device, the semiconductor light-emitting device according to the present invention enables 10% improvement in IQE.

FIG. 7 is a table showing the improvement of light extraction efficiency in the semiconductor light-emitting device according to the present invention by comparing light extraction efficiency in a related art semiconductor light-emitting device with light extraction efficiency in the semiconductor light-emitting device according to the present invention.

The related art semiconductor light-emitting device which is not provided with the protrusion shows only 26% light extraction efficiency, as shown in (a) of FIG. 7. Meanwhile, the semiconductor light-emitting device according to the present invention, which is provided with the protrusions 312 on the substrate 310, shows about 69% light extraction efficiency, as shown in (b) of FIG. 7. In comparison with the related art semiconductor light-emitting device, the semiconductor light-emitting device according to the present invention enables 40% improvement in light extraction efficiency.

Accordingly, the wet-etching process is carried out after the dry-etching process so as to form the protrusions 312 on the surface of the substrate 310 for growing the nitride semiconductor material thereon, to thereby remove the byproducts 500 from the surface of the substrate 310.

As the wet-etching process is carried out after the dry-etching process, it is possible to omit the organic cleaning process after the dry-etching process, to thereby simplify the entire process.

According as one or more protrusions 312 are formed on the substrate 310, some of the transverse light can be extracted so that the light extraction efficiency can be improved.

The decreased dislocation of the nitride semiconductor layer according to the present invention enables about 10% improvement in IQE.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing a semiconductor light-emitting device comprising:
   coating a substrate with photoresist;
   forming a mask pattern on the substrate by selectively removing the photoresist;
   forming protrusions on the substrate by dry-etching the substrate with the mask pattern through the use of etching gas;
   wet-etching the dry-etched substrate through the use of etching solution with the mask pattern remaining, the mask pattern being removed by the wet-etching;
   forming a first semiconductor layer on the substrate including the protrusions;
   forming an active layer on the first semiconductor layer;
   forming a second semiconductor layer on the active layer;
   etching predetermined portions of the active layer and second semiconductor layer until the first semiconductor layer is exposed; and
   forming a first electrode on a predetermined portion of the first semiconductor layer, wherein the active layer and second semiconductor layer are not formed on the predetermined portion of the first semiconductor layer, and forming a second electrode on the second semiconductor layer,
   wherein the process of wet-etching the substrate is carried out by using an etching solution which is obtained by mixing sulfuric acid and hydrogen peroxide in a ratio of 1:1 or 1:2.

2. A method for manufacturing a semiconductor light-emitting device comprising:
   forming a mask pattern on a substrate to form protrusions;
   forming the protrusions on the substrate by dry-etching the substrate with the mask pattern through the use of etching gas;
   wet-etching the dry-etched substrate through the use of etching solution with the mask pattern remaining, the mask pattern being removed by the wet-etching; and
   forming a light-emitting device layer on the wet-etched substrate,
   wherein the process of wet-etching the substrate is carried out by using an etching solution which is obtained by mixing sulfuric acid and hydrogen peroxide in a ratio of 1:1 or 1:2.

3. The method according to claim 1 or 2, wherein the process of dry-etching the substrate uses Cl-based gas selected from a group including $Cl_2$, $BCl_3$, HCl, and $CCl_4$; or HBr-based gas including HBr.

4. The method according to claim 1 or 2, wherein the process of wet-etching the substrate is carried out by etching the surfaces of the substrate and the protrusions under the wet atmosphere through the use of etching solution capable of corroding and melting byproducts remaining on the surfaces of the dry-etched substrate and the protrusions.

5. The method according to claim 1 or 2, wherein the process of wet-etching the substrate is carried out by any one of dipping method, spraying method, and spinning method.

6. The method according to claim 1 or 2, wherein a cross section of the protrusions is formed in a curved-surface shape or polygonal shape.

7. The method according to claim 1 or 2, wherein the substrate is formed of any one of sapphire substrate, SiC substrate, and GaN substrate.

8. The method according to claim 2, wherein the process of forming the light-emitting device layer comprises:
   forming a first semiconductor layer on the substrate including the protrusions;
   forming an active layer on the first semiconductor layer;
   forming a second semiconductor layer on the active layer;
   etching predetermined portions of the active layer and second semiconductor layer until the first semiconductor layer is exposed; and
   forming a first electrode on a predetermined portion of the first semiconductor layer, wherein the active layer and second semiconductor layer are not formed on the predetermined portion of the first semiconductor layer, and forming a second electrode on the second semiconductor layer.

9. The method according to claim 1 or 2, wherein the process of wet-etching the substrate is carried out at a temperature within a range of 90° C.~120° C.

10. A method for manufacturing a semiconductor light-emitting device comprising:
    forming a mask pattern on a substrate to form protrusions;
    forming the protrusions on the substrate by dry-etching the substrate with the mask pattern through the use of etching gas;
    wet-etching the dry-etched substrate through the use of etching solution with the mask pattern remaining, the mask pattern being removed by the wet-etching; and
    forming a light-emitting device layer on the wet-etched substrate,
    wherein the process of wet-etching the substrate is carried out by using an etching solution which is obtained by mixing sulfuric acid and phosphoric acid in a ratio of 1:1 or 1:2.

* * * * *